(12) United States Patent
Shanmugamani et al.

(10) Patent No.: US 11,468,024 B2
(45) Date of Patent: Oct. 11, 2022

(54) STRUCTURAL DATA MATCHING USING NEURAL NETWORK ENCODERS

(71) Applicant: SAP SE, Walldorf (DE)

(72) Inventors: Rajalingappaa Shanmugamani, Singapore (SG); Jiaxuan Zhang, Singapore (SG)

(73) Assignee: SAP SE, Walldorf (DE)

(\*) Notice: Subject to any disclaimer, the term of this patent is extended or adjusted under 35 U.S.C. 154(b) by 360 days.

(21) Appl. No.: 15/937,216

(22) Filed: Mar. 27, 2018

(65) Prior Publication Data

US 2019/0303465 A1 Oct. 3, 2019

(51) Int. Cl.
*G06F 16/22* (2019.01)
*G06F 16/28* (2019.01)
(Continued)

(52) U.S. Cl.
CPC ........ *G06F 16/2237* (2019.01); *G06F 16/221* (2019.01); *G06F 16/2264* (2019.01);
(Continued)

(58) Field of Classification Search
CPC .............. G06F 16/2237; G06F 16/248; G06F 16/2264; G06F 16/283; G06F 16/221;
(Continued)

(56) References Cited

U.S. PATENT DOCUMENTS

| | | | |
|---|---|---|---|
| 10,970,629 B1 * | 4/2021 | Dirac | G06N 3/04 |
| 2006/0149692 A1 * | 7/2006 | Hercus | G06N 3/082 |
| | | | 706/15 |

(Continued)

FOREIGN PATENT DOCUMENTS

EP 1995878 A2 11/2008

OTHER PUBLICATIONS

Baxter [online], "How to Match Similar Data Tables in Excel with Fuzzy Lookup," Builtvisible, Nov. 16, 2017, [retrieved on Mar. 26, 2019], retrieved from: URL<https://builtvisible.com/match-similar-not-exact-data-points-excel/>, 4 pages.

Belief et al. [online], "A Survey on Metric Learning for Feature Vectors and Structured Data," Arxiv.org: arXiv preprint arXiv:1306.6709, Jun. 27, 2013, [retrieved on: Mar. 25, 2019], retrieved from: URL<https://arxiv.org/abs/1306.6709>, 59 pages.

(Continued)

*Primary Examiner* — Ashish Thomas
*Assistant Examiner* — Yohanes D Kelemework
(74) *Attorney, Agent, or Firm* — Fish & Richardson P.C.

(57) ABSTRACT

Implementations of the present disclosure include methods, systems, and computer-readable storage mediums for receiving first and second data sets, both the first and second data sets including structured data in a plurality of columns, for each of the first data set and the second data set, inputting each column into an encoder specific to a column type of a respective column, the encoder providing encoded data for the first data set, and the second data set, respectively, providing a first multi-dimensional vector based on encoded data of the first data set, providing a second multi-dimensional vector based on encoded data of the second data set, and outputting the first multi-dimensional vector and the second multi-dimensional vector to a loss-function, the loss-function processing the first multi-dimensional vector and the second multi-dimensional vector to provide an output, the output representing matched data points between the first and second data sets.

17 Claims, 9 Drawing Sheets

(51) Int. Cl.
  *G06F 16/248* (2019.01)
  *G06N 3/08* (2006.01)
  *G06N 3/04* (2006.01)
  *H03M 7/30* (2006.01)

(52) U.S. Cl.
  CPC .......... *G06F 16/248* (2019.01); *G06F 16/283* (2019.01); *G06N 3/0454* (2013.01); *G06N 3/08* (2013.01); *H03M 7/3082* (2013.01); *G06N 3/082* (2013.01); *G06N 3/084* (2013.01)

(58) Field of Classification Search
  CPC ..... H03M 7/3082; G06N 3/0454; G06N 3/08; G06N 3/084; G06N 3/082; G06K 9/6215
  See application file for complete search history.

(56) References Cited

U.S. PATENT DOCUMENTS

| | | | |
|---|---|---|---|
| 2010/0030796 A1* | 2/2010 | Netz | G06F 16/24561 707/756 |
| 2016/0267397 A1* | 9/2016 | Carlsson | G16H 50/20 |
| 2017/0032035 A1* | 2/2017 | Gao | G06N 3/08 |
| 2017/0262491 A1* | 9/2017 | Brewster | G06F 16/221 |
| 2018/0240243 A1* | 8/2018 | Kim | G06N 3/0454 |
| 2019/0155904 A1* | 5/2019 | Santos Moraes | G06F 40/279 |

OTHER PUBLICATIONS

Chatterjee et al. [online], "Similarity Learning with (or without) Convolutional Neural Network," CS 598 LAZ: Cutting-Edge Trends in Deep Learning and Recognition, Feb. 16, 2017, [retrieved on Mar. 25, 2019, retrieved from: URL<http://slazebni.cs.illinois.edu/spring17/lec09_similarity.pdf>, 75 pages.

Costa, "Probabilistic Interpretation of Feedforward Network Outputs, with Relationships to Statistical Prediction of Ordinal Quantities," International Journal of Neural Systems, vol. 7, No. 5, Nov. 1996, 14 pages.

Extended European Search Report issued in European Application No. 18196739.9 dated Apr. 10, 2019, 13 pages.

Li et al. [online], "Generative Moment Matching Networks," Arxiv. org: arXiv:1502.02761v1g, Feb. 10, 2015, [retrieved on: Mar. 25, 2019], retrieved from: URL<https://arxiv.org/abs/1502.02761 >, 9 pages.

Schroff et al., "FaceNet: A Unified Embedding for Face Recognition and Clustering," Proceedings of the IEEE conference on computer vision and pattern recognition, Jun. 2015, 9 pages.

U.S. Appl. No. 16/208,681, Saito et al., "Representing Sets of Entitites for Matching Problems," filed on Dec. 4, 2018.

U.S. Appl. No. 16/210,070, Le et al., "Graphical Approach To Multi-Matching," filed on Dec. 5, 2018.

U.S. Appl. No. 16/217,148, Saito et al., "Utilizing Embeddings for Efficient Matching of Entities," filed on Dec. 12, 2018.

Zhang et al., "Character-level Confultional Networks for Text Classification," Advances in neural information processing systems, Sep. 2015, 9 pages.

Communication Pursuant to Article 94 (3) EPC issued in European Application No. 18196739.9 dated Apr. 13, 2021, 9 pages.

Nikipedia.org [online], "Microsoft Excel—Wikipedia" Mar. 2018, [retrieved on Apr. 7, 2021], retrieved from: URL <https://en.wikipedia.org/wlindexphp?title=Microsoft_Excel&oldid=830205165>, 23 pages.

* cited by examiner

Computer System Performance

| Date | Time | | | |
|---|---|---|---|---|
| 1/5/2018 | 9:28 AM (CT) | | | |
| System No. | Provider | Performance | Comp. Period (sec) | Messages |
| 58.172 | APPLE | %50.21 | 110652.8 | Yes |
| 21.982 | DELL | %89.91 | 1347.2 | It's getting too hot |
| 3.017 | APPLE | %16.7 | 5986.3 | Too slow. Help! |

IT Alerts

| System No. | Time | Date | Performance |
|---|---|---|---|
| 21.982 | 10:28AM (ET) | 01/05/2018 | %89.91 |
| SC-1125 | 04:05AM (PT) | 12/29//2017 | %75.98 |
| 795 | 01:45AM (CT) | 02/03/2017 | %2.16 |
| 3.017 | 10:28AM (CT) | 01/05/2018 | %26.7 |
| EZTP | 12:37PM (ET) | 10/16/2017 | %55.23 |

FIG. 2

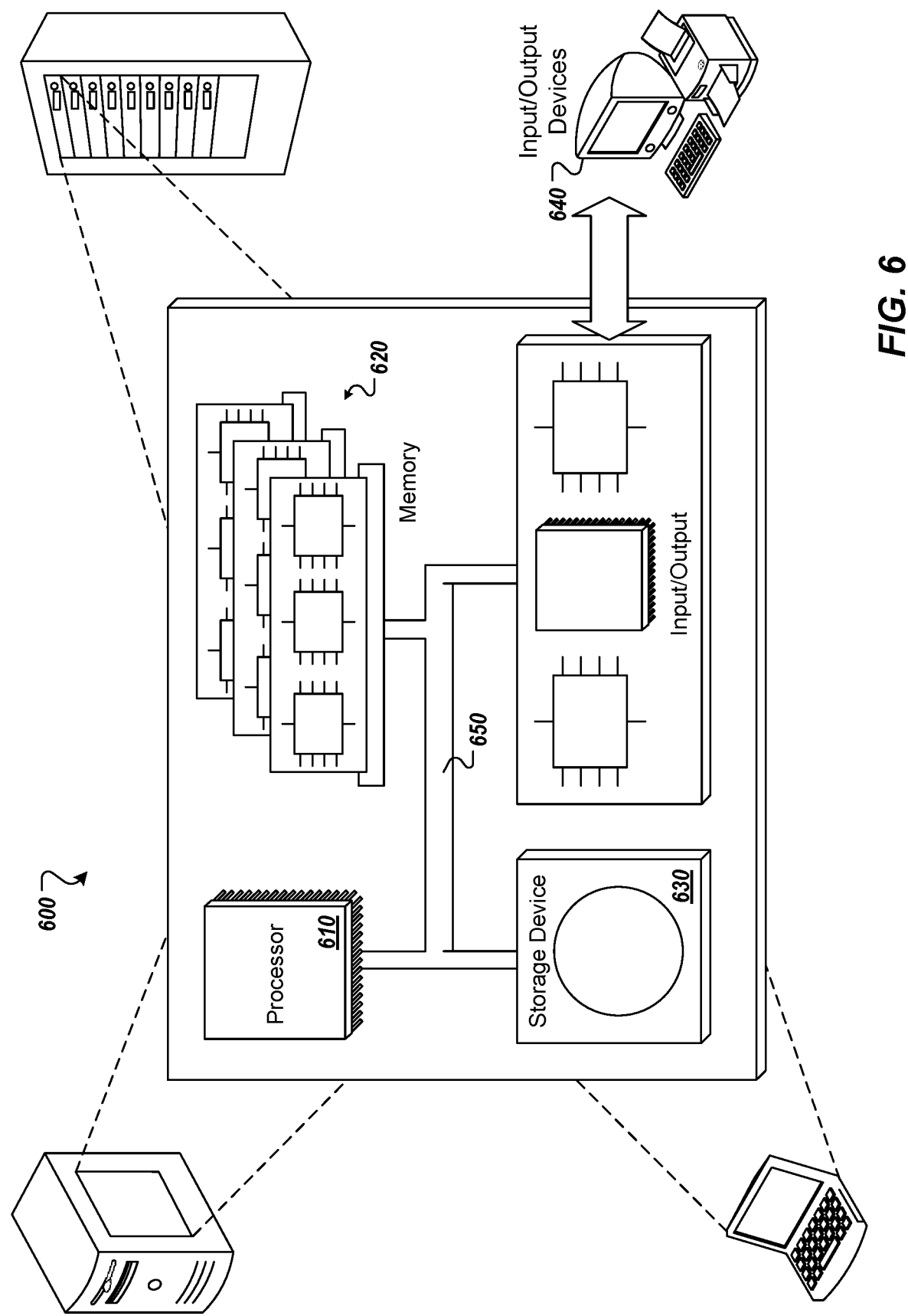

STRUCTURAL DATA MATCHING USING NEURAL NETWORK ENCODERS

BACKGROUND

Database systems can store massive numbers of data sets. In some instances, data sets can be related. In an example context, a first data set can represent computer system performance, and a second data set can represent information technology (IT) alerts that were generated in response to the computer system performance. Matching data between data sets can be used to associate data sets, and match like data items. In particular, data matching can include determining an association between a query data point (e.g., a computer system performance), and a target data point (e.g., an IT alert).

Traditional approaches to data matching can include a rules-based approach that provides a set of rules defining data values to be matched. Such traditional systems, however, can be resource inefficient, and fail to provide an accurate, or clear result. For example, for a query data point, traditional approaches may provide a ranked list of candidate target data points, as opposed to an exact match. Consequently, additional resources, and time may need to be expended to identify the exact match from the ranked list, if even present in the ranked list.

SUMMARY

Implementations of the present disclosure include computer-implemented methods for data matching structured data sets. More particularly, implementations of the present disclosure are directed to data matching problem between structured data sets using deep learning.

In some implementations, actions include receiving a first data set and a second data set, both the first data set and the second data set including structured data in a plurality of columns, for each of the first data set and the second data set, inputting each column into an encoder specific to a column type of a respective column, the encoder providing encoded data for the first data set, and the second data set, respectively, providing a first multi-dimensional vector based on encoded data of the first data set, providing a second multi-dimensional vector based on encoded data of the second data set, and outputting the first multi-dimensional vector and the second multi-dimensional vector to a loss-function, the loss-function processing the first multi-dimensional vector and the second multi-dimensional vector to provide an output, the output representing matched data points between the first data set, and the second data set. Other implementations include corresponding systems, apparatus, and computer programs, configured to perform the actions of the methods, encoded on computer storage devices.

These and other implementations may each optionally include one or more of the following features: a same encoder is used to provide the encoded data of the first data set, and the encoded data of the second data set; prior to the encoder providing encoded data, data values of one or more of the first data set, and the second data set are pre-processed to provide revised data values; pre-processing includes pre-appending one or more zeros to a numerical data value; pre-processing includes pre-appending one or more spaces to a string data value; actions further include filtering at least one column from each of the first data set, and the second data set prior to providing encoded data; and actions further include determining a column type for each column of the plurality of columns.

The present disclosure also provides one or more non-transitory computer-readable storage media coupled to one or more processors and having instructions stored thereon which, when executed by the one or more processors, cause the one or more processors to perform operations in accordance with implementations of the methods provided herein.

The present disclosure further provides a system for implementing the methods provided herein. The system includes one or more processors, and a computer-readable storage medium coupled to the one or more processors having instructions stored thereon which, when executed by the one or more processors, cause the one or more processors to perform operations in accordance with implementations of the methods provided herein.

It is appreciated that methods in accordance with the present disclosure may include any combination of the aspects and features described herein. That is, methods in accordance with the present disclosure are not limited to the combinations of aspects and features specifically described herein, but also include any combination of the aspects and features provided.

The details of one or more implementations of the present disclosure are set forth in the accompanying drawings and the description below. Other features and advantages of the present disclosure will be apparent from the description and drawings, and from the claims.

DESCRIPTION OF DRAWINGS

FIG. 2 depicts example data sets in accordance with implementations of the present disclosure.

FIG. 6 is a schematic illustration of example computer systems that can be used to execute implementations of the present disclosure.

Like reference symbols in the various drawings indicate like elements.

DETAILED DESCRIPTION

Figure 1:
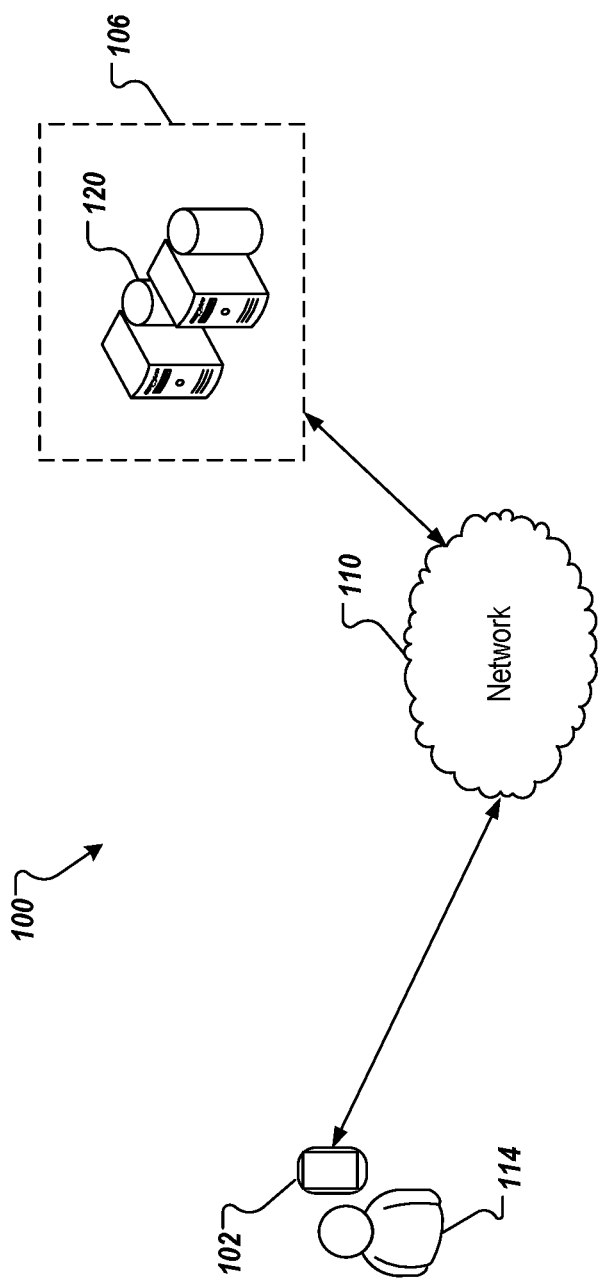
FIG. 1 depicts an example environment that can be used to execute implementations of the present disclosure.

Implementations of the present disclosure include computer-implemented methods for data matching structured data sets. More particularly, implementations of the present disclosure are directed to data matching problem between structured data sets using deep learning. In some implementations, actions can include receiving a first data set and a second data set, both the first data set and the second data set including structured data in a plurality of columns, for each of the first data set and the second data set, inputting each column into an encoder specific to a column type of a respective column, the encoder providing encoded data for the first data set, and the second data set, respectively, providing a first multi-dimensional vector based on encoded data of the first data set, providing a second multi-dimensional vector based on encoded data of the second data set, and outputting the first multi-dimensional vector and the second multi-dimensional vector to a loss-function, the loss-function processing the first multi-dimensional vector and the second multi-dimensional vector to provide an output, the output representing matched data points between the first data set, and the second data set.

To provide further context for implementations of the present disclosure, and as introduced above, matching data points between disparate data sets can be a time, and resource intensive task. This is particularly true in database systems having millions, if not billions of data points between data sets that are to be matched. Some traditional matching techniques can use rule sets, and require the matching to strictly follow these rules. This can result in inefficiencies in matching data points. For example, instead of an exact match between a query data point and a target data point, traditional approaches may provide a list of target data points (e.g., ranked list) representing multiple, potential matches. Further, the rules do not automatically adjust to new matching scenarios (e.g., new query data points or new target data points), and need to be changed for different matching scenarios. What is missing in the traditional solving of matching problems is evaluating and processing the characteristics of the data itself. That is, for example, there are many data characteristics intrinsic to the structure of data.

In view of this, implementations of the present disclosure leverages deep learning to use characteristics of the data structure to match data between data sets. Deep neural networks, used in deep leaning, have been widely used in computer vision and natural language processing (NLP). Implementations of the present disclosure apply deep learning techniques for data set matching to identify singular, exacts matches between a query data point and a target data point.

Implementations of the present disclosure provide techniques to match data based on data structure. In accordance with implementations of the present disclosure, neural networks are provided for feature extraction from structure of the data, and to find matching data from one or more first ("query") data sets to one or more second ("target") data sets. Deep learning techniques are used to embed encoded target and query data sets into a latent (or ambient) space, and provide comparable multi-dimensional vectors for determining matching data in the two data sets. In some implementations, the encoding process on each database is performed by one or more encoders based on type of the data to be encoded. In some implementations, the data sets include structured data, and have one or more columns of data. In some examples, each column is encoded based on the type of data in the column. That is, for example, each encoder is specific to a data type (or column type), and encodes only the data of that type.

In some implementations, after processing of the data from the data sets, multi-dimensional vectors are provided from the encoded data. In some examples, the multi-dimensional vectors are comparable, and are output to a loss-function to determine matching data points between the data sets. In some examples, for each data column in the query data set, one or more matching data columns are identified in the target data set.

Implementations of the present disclosure are described in further detail herein with reference to an example context. The example context includes a query data set from a computer system (for example, a company with one or more computer devices), and a target dataset from an Information Technology ("IT") provider. In the example context, matches between a record (data) in the query data set and a record in the target data set are provided using implementations of the present disclosure. It is contemplated, however, that implementations of the present disclosure can be realized with any appropriate context (e.g., financial records, personal records, medical records).

FIG. 1 depicts an example environment 100 that can be used to execute implementations of the present disclosure. In some examples, the example environment 100 enables users associated with respective entities to request and receive matched data sets. The example environment 100 includes a computing device 102, a back-end system 106, and a network 110. In some examples, the computing device 102 is used by a user 114 to log into, and interact with a platform that performs data matching of the present disclosure.

In the depicted example, the back-end system 106 includes at least one server system 120. In some examples, the at least one server system 120 hosts one or more computer-implemented services that users can interact with using computing devices. For example, the back-end system 106 can host computer-implemented data matching services in accordance with implementations of the present disclosure.

In the depicted example, the computing device 102 is depicted as a mobile computing device. It is contemplated, however, that implementations of the present disclosure can be realized with any appropriate type of computing device (e.g., smartphone, tablet, laptop computer, desktop computer, voice-enabled devices). In some examples, the network 110 includes a local area network (LAN), wide area network (WAN), the Internet, or a combination thereof, and connects web sites, user devices (e.g., the computing device 102), and back-end systems (e.g., the back-end system 106). In some examples, the network 110 can be accessed over a wired and/or a wireless communications link. For example, mobile computing devices, such as smartphones can utilize a cellular network to access the network 110.

In some examples, the computing device 102 includes a computer-executable application executed thereon, which can be used to log into a platform that provides data matching services of the present disclosure. In some examples, the computing device 102 includes a web browser application executed thereon, which can be used to display one or more web pages that provide data matching services of the present disclosure.

In accordance with implementations of the present disclosure, data of two or more data sets is processed to match data points between the data sets. In some implementations, data points are matched between at least one query data set, and at least one target data set. In some implementations, the data sets include structured data in columns, and each column stores one or more data points. In some examples, data points of one data set are to be matched with data points of other data sets.

FIG. 2 depicts example data sets in accordance with implementations of the present disclosure. The example data sets 200 include a query data set 202, and a target data set 204. The query data set 202 includes records of system performance, and the target data set 204 includes IT alerts recorded based on the system performance. In the depicted example, the data in the query data set 202, and the target data set 204 is structured in columns. Columns 206, 208, 210 are example columns in the query data set 202, and column 212 is an example column in the target data set 204. Each column stores one or more data points (e.g., data points 214, 218 in columns 210, 212, respectively).

In accordance with implementations of the present disclosure, each column is processed to determine a column type of the column. In some implementations, each column has only one column type. Example column types include, without limitation, categorical, numerical, string, and date. Each column type indicates that the data points in the respective column share particular features.

In some implementations, a numerical column refers to the columns with numbers (including decimals) as data points. In some implementations, a string column refers to columns with free text as data points. In the depicted example, data column 222 is a numerical column. In some implementations, a categorical column indicates that the data points in the respective column are bounded by a set of options. For instance, a column with only "male" and "female" options can be a categorical column. In the depicted example, the column 208 is a categorical column, because there are limited options for each data point in column 208.

In some implementations, a column can be determined to be categorical based on a degree of variation between data points stored within the column. For example, data values of the column can be compared to determine a number of unique data values. The number of unique values can indicate a degree of variation across the data points. In some examples, a categorical type is indicated by data points having a relatively low degree of variation (e.g., less than a threshold number of unique values). For example, a column having "male" and "female" data points has a relatively low degree of variation (e.g., only two unique values). A column having numbers can indicate a relatively high degree of variation (e.g., hundreds/thousands of unique values). For example, data points in columns 210, 220 can be categorized as either numerical or categorical. However, in the depicted example, these columns are categorized as numerical columns, because there the number of unique values for the data points exceeds a threshold number.

In some implementations, the date columns refers to columns that have dates as data points. In some implementations, since the number of possible values are limited, columns that include date as data points are considered as categorical columns. In some examples, each date data point is split into three values (e.g., day, month, year), and a column with date data points is split into three columns (which may each be determined as numerical or categorical columns).

Data points in a column can be transferred to an input vector space. For example, a data point can be transferred into the input vector space based on the characters in the data point. In some examples, each character can be assigned a unique number, and the unique number is transferred to the input vector space. In some implementations, a global character map that includes all characters that may occur in a data point is utilized. For example, a global character map may cover English lower case letters, English upper case letters, numbers, and special characters (e.g., %, @). Such a global character map can cover, for example, 68 characters. A data point can be transferred to an input vector based on the unique numbers that the global character map provides for the data point's characters. In some examples, the global character map can act as a dictionary and map each character to a group of characters (e.g., a word). For example, each character can be mapped to an n-gram word in the input vector space.

In some implementations, the data points of each column of the query data set and the target data set are pre-processed to provide comparable data points in the respective column. In some examples, the pre-processing generates data points of equal length in each column. In some examples, the pre-processing is performed on each column based on the type of the column. In some examples, new data points for a column are generated by determining maximum length of data points in the column and generating the new data points all with a length equal to the maximum length.

Figure 3A:
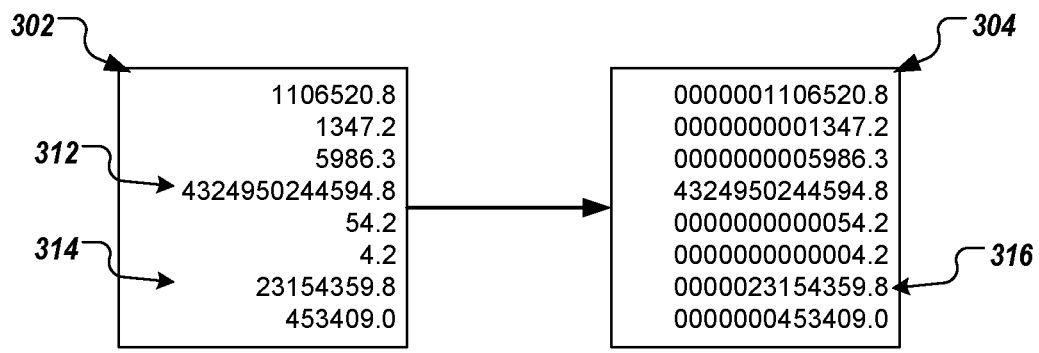
FIGS. 3A and 3B depict example preprocessing in accordance with implementations of the present disclosure.
Figure 3B:
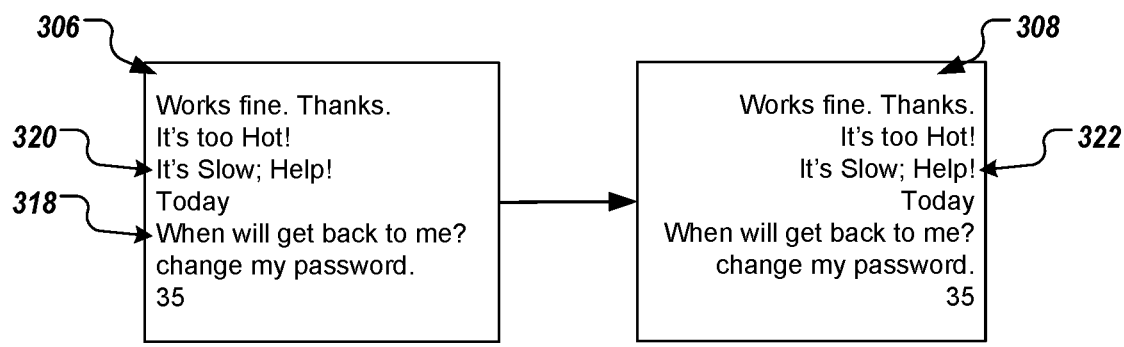

FIGS. 3A and 3B depict example pre-processing in accordance with implementations of the present disclosure. In FIG. 3A, a numerical column 302 is pre-processed to provide a revised numerical column 304. In this example, a data point with maximum length (e.g., data point 312) is determined and new data points (e.g., data point 316) are provided by increasing the length of all other data points (e.g., data point 314) to the length of the maximum length by prepending zeros. In FIG. 3B, a string (or a categorical) column 306 is pre-processed to provide a revised string (or categorical) column 308. In this example, a data point with maximum length (e.g., data point 318) is determined and new data points (e.g., data point 322) are provided by increasing the length of all other data points (e.g., data point 320) to the length of the maximum length by prepending spaces. Other examples of pre-processing can include adding one or more predefined characters (e.g., *, or –) to match the lengths of the data points in a column. For example, to differentiate these one or more predefined characters from other characters in a data point, the predefined characters can be provided in the global character map as pre-processing (or null) characters.

In accordance with implementations of the present disclosure, the data columns are input to a neural network that includes one or more layers, to be processed and encoded. In some implementations, the process and encoding (e.g., type or number of layers) varies based on the type of column that is being processed. In some implementations, the encoding at least partially depends on the column type and partly is shared between all types of columns.

Figure 4A:
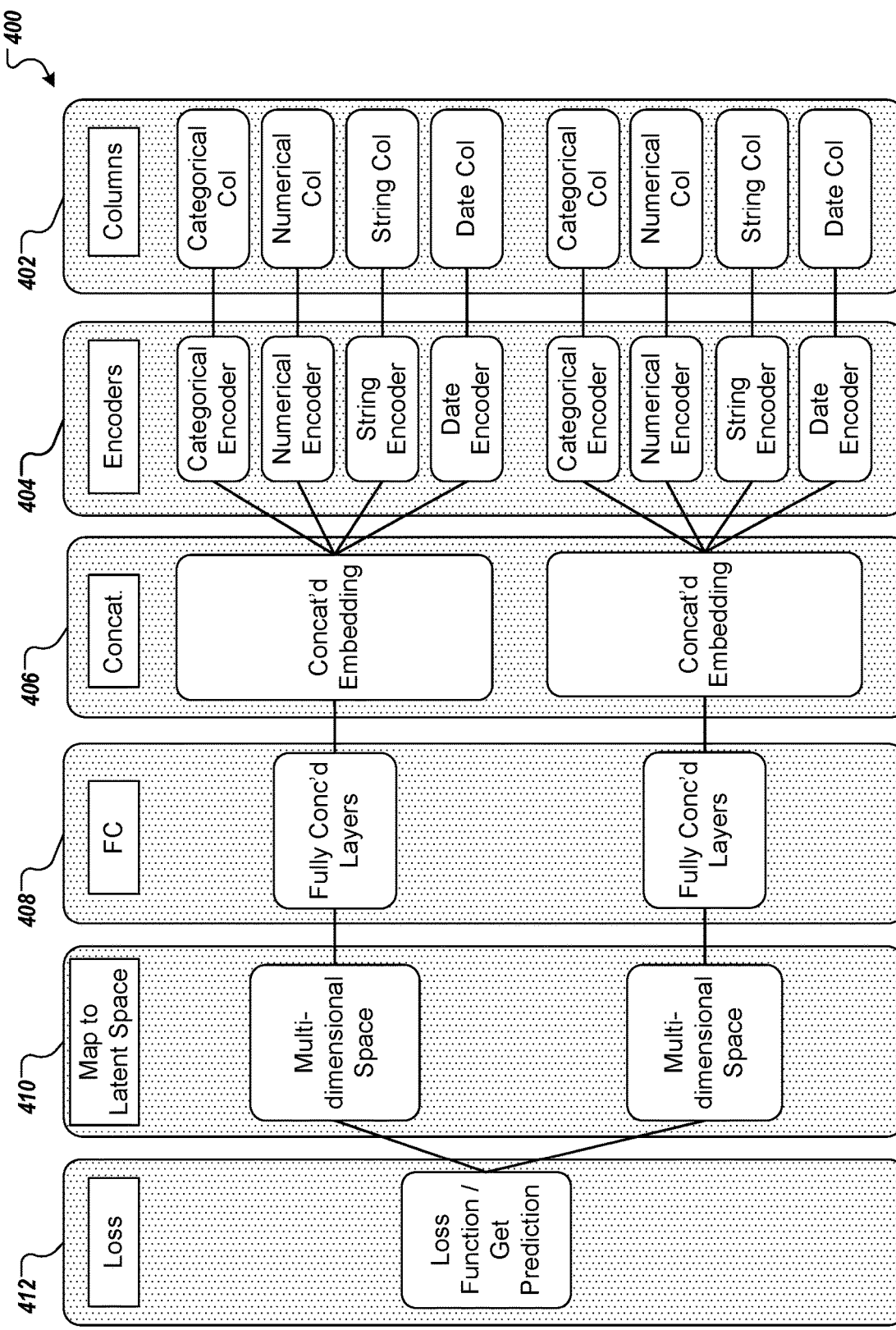
FIGS. 4A-4D depict example processes that can be executed in accordance with implementations of the present disclosure.

FIGS. 4A-4D depict example processes that can be executed in accordance with implementations of the present disclosure. FIG. 4A is a high level view of an example series of processing layers 400 performed on columns of a query data set, and a target data set. The layers 400 include column-type determination 402, column encoding 404, concatenation embedding 406, fully connected layers 408, map-to-latent space 410, and loss determination 412.

The column-type determination layer 402 determines the type of each column in each of the query data set, and the target data set, as described herein. In some implementations, column-type determination also includes pre-processing of data points, as also described herein. Each column is input to a respective encoder 404 based on the type of the column. The type-dependent outputs of the encoders 404 are concatenated at concatenation embedding 406, and are further processed in one or more fully connected layers 408. The output of the fully connected layers for each of the query data set, and the target data set is mapped to a latent space 410 to provide multi-dimensional vectors with a pre-determined dimension for each of the query data set, and the target data set. In some implementations, the multi-dimensional vectors for the query data set, and the target data set have equal dimensions. These multi-dimensional vectors are compared using loss determiner 412 to identify matching data points, and/or columns between the query data set, and the target data set.

In some implementations, the column type encoder 404 includes one or more encoders that target a column based on the type of the column. In some implementations, an encoder in 404 is specific to the column type that the encoder accepts as input. In some implementations, the number, and/or type of layers of an encoder that targets a first column type differ from the number, and/or type of layers of an encoder that targets a second column type. In some implementations, the encoders 404 includes fully connected, convolution, and Long Short-Term Memory (LTSM) layers. In some implementations, the size of output of each encoder type differs from the size of other encoder types. In one non-limiting example, the output of each categorical encoder takes up to 20 dimensions, the output of each numerical encoder takes up to 5 dimensions, and the output of each string encoder take up to 128 dimensions.

Figure 4B:
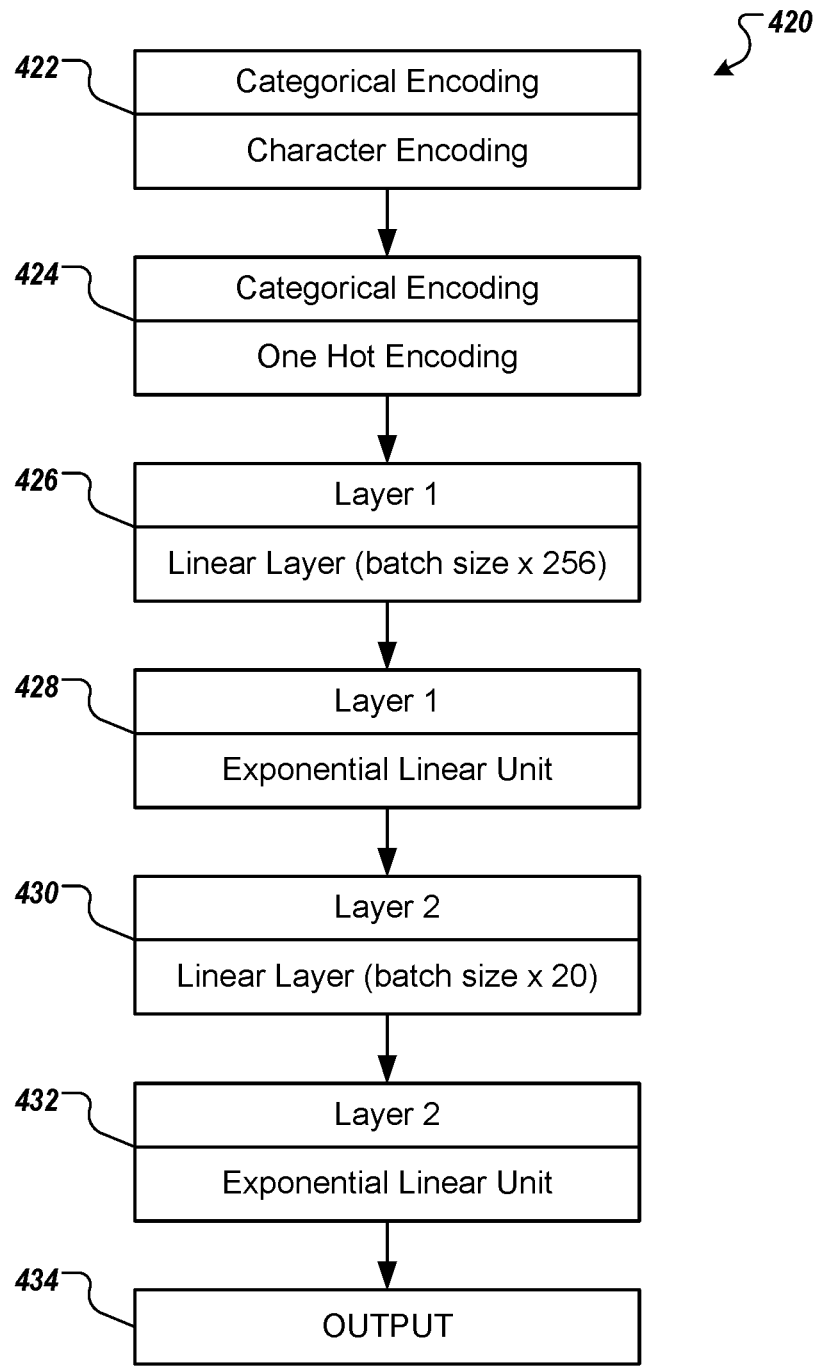
Figure 4C:
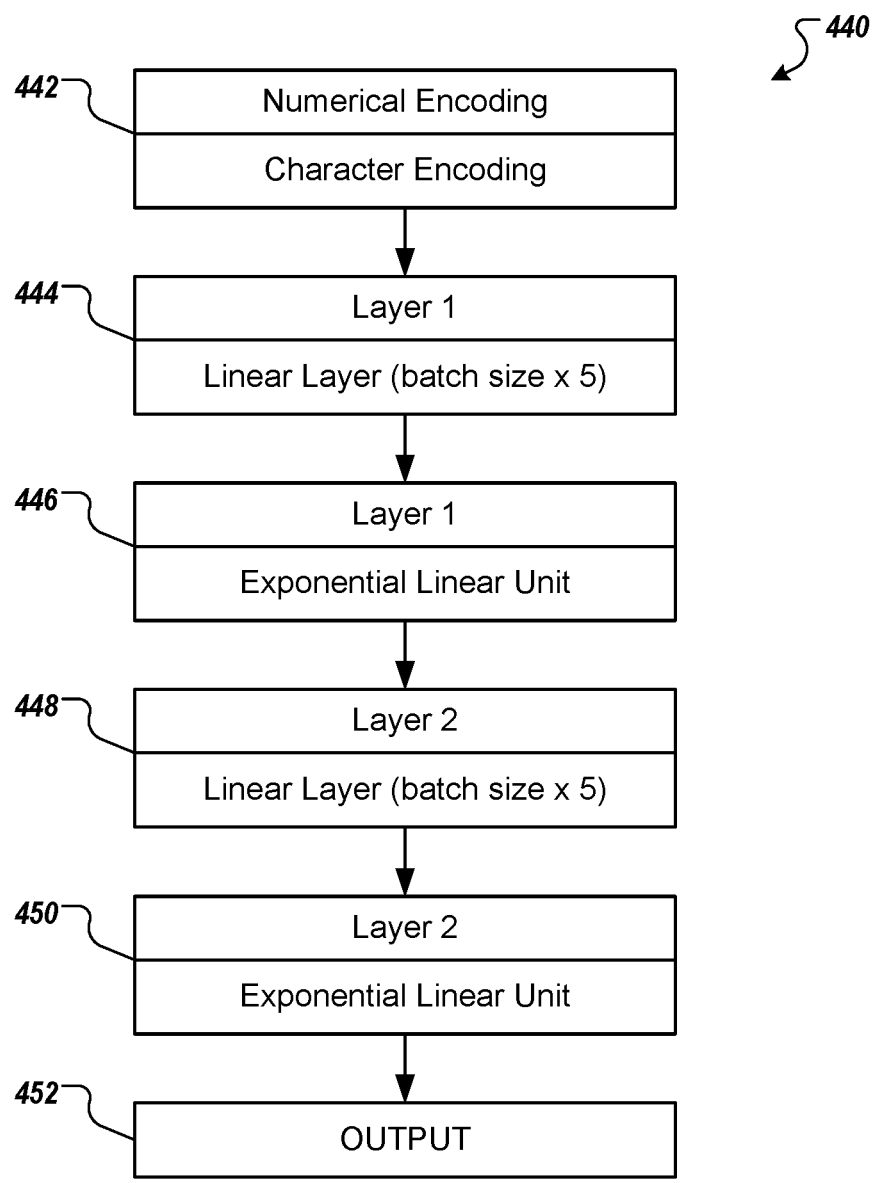

FIGS. 4B and 4C provide example encoders at column type encoder 404. FIG. 4B depicts an example encoder 420 for categorical columns. The encoder 420 performs two categorical encodings 422, 424. In some examples, the encoder 420 includes two neural network layers, represented by 426, 428, 430, 432. The output 434 of the categorical encoder is input to the concatenation embedding 406.

The categorical encodings in the example encoder 420 perform character encoding, and one hot encoding. In some examples, the character encoding encodes each data point to a pre-set code. For example, at character encoding, the first and the third data points illustrated in column 208 of FIG. 2 are encoded to a pre-set code 1, and the second data point in column 208 is encoded to a code 2.

In some examples, the one hot encoding encodes each data point to a group of bits with a single high bit (e.g., 1), and a single low bit (e.g., 0) for other bits. In these examples, the length of the group of bits depends on the number of data point variations in a column. For example, assuming that there are only three variations of "APPLE," "DELL," and "OTHERS" for the data points in column 208, each of these variations is assigned to a group of bits with only one high in a unique bit location. For example, APPLE can be assigned to [0,0,1], DELL to [0,1,0], and OTHERS to [1,0,0]. In some examples, the one hot encoding is performed on every character using the global character map. For example, if there are five characters in a global character map, a data point ABC may be presented as [1,0,0,0,0], [0,1,0,0,0], [0,0,1,0,0].

In some implementations, the two neural network layers (426,428; 430, 432) in the encoder 420 are fully connected layers. In the example depicted in FIG. 4B, the first neural network layers (Layer 1: 426, 428) has 256 dimensions and the second neural network layers (Layer 2: 430, 432) has 20 dimensions. Other dimensions for these layers are also feasible. For example, the 426 and 428 can have 512 or 64 dimensions, and the 430 and 432 can have 10, 5, or 30 dimensions. Each of the layers, Layer 1, and Layer 2 includes a linear layer, and an exponential linear unit. A neuron in a linear layer can be connected to all neurons (or activations) in a layer right before the linear layer (also can be referred to as the "previous layer"). In an example linear layer, activation of every neuron of the linear layer is a dot product of the activations of neurons of the previous layer and weights of the neuron (at the current layer). For example, if the weights of a neuron in the linear layer are [$w_1$ $w_2$ $w_3$] and activations of the previous layer (previous to the linear layer) are [$c_1$ $c_2$ $c_3$], activation of the neuron in the linear layer can be $w_1 c_1 + w_2 c_2 + w_3 c_3$. The exponential linear unit is used as activation functions in the fully connected Layer 1, and Layer 2. Activation of every neuron of an exponential layer can be an exponential function of the activations of the neurons of the previous layer. In an example, activation of a neuron of an exponential layer can be an exponential function of a dot product of the activations of neurons of the previous layer and weights of the neuron (at the current layer). For example, if the weights of a neuron in the linear layer are [$w_1$ $w_2$ $w_3$] and activations of the previous layer (previous to the linear layer) are [$c_1$ $c_2$ $c_3$], activation of the neuron in the linear layer can be provided as:

$$\frac{1}{1 + e^{(w1c1+w2c2+w3c3)}}$$

In some examples, the weight of the network (e.g., the overall network) is initialized with zero mean and 0.05 standard deviation. For example, the initial weight of all neurons (e.g., before the network is trained) can be set to 0.05.

FIG. 4C depicts an example encoder 440 for numerical columns. The encoder 440 performs includes numerical encoding 442, neural network layers 444, 446; 448, 450, respectively. An output 452 of the numerical encoder is input to the concatenation embedding 406. In some examples, the numerical encoding in the example encoder 440 includes character encoding. In some examples, the character encoding encodes each number (at a data point) to a pre-set code. For example, the first data point of column 220 can be encoded to a pre-set code 1 (e.g., 10100111).

In some implementations, the neural network layers in the encoder 440 are fully connected layers with dimension of 5 (e.g., five neurons on each layer). A skilled person in the art would realize that dimension of 5 has been selected for description purposes and other dimensions (e.g., 10, 20) are also feasible. Each of the layers, Layer 1, and Layer 2 includes a linear layer and an exponential linear unit. A linear layer in the numerical encoder 440 can be similar (e.g., have similar weights) or different (e.g., different weights in one or more neurons) from a linear layer in the categorical encoder 420. The exponential linear unit is used as activation functions in the fully connected Layer 1, and Layer 2. An exponential layer in the numerical encoder 440 can be similar (e.g., have similar weights) or different (e.g., different weights in one or more neurons) from an exponential layer in the categorical encoder 420. In some examples, the weight of the network is initialized with zero mean and 0.05 standard deviation.

Figure 4D:
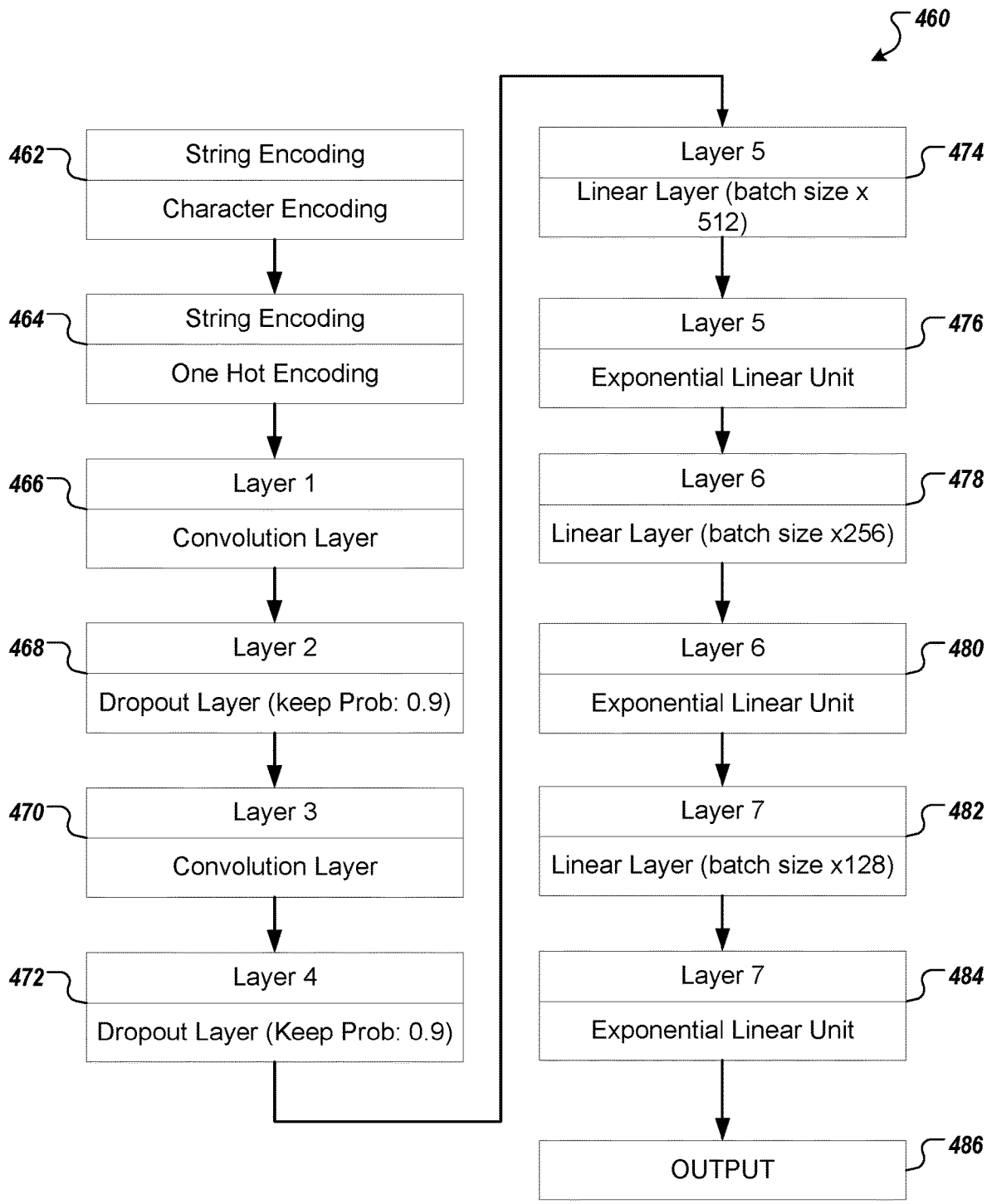

FIG. 4D depicts an example encoder 460 for string columns. The encoder 460 performs two string encodings 462, 464, and includes seven neural network layers 466, 468, 470, 472, 474-476, 478-480, 482-484. An output 486 of the string encoder is input to the concatenation embedding 406.

The string encodings 462, 464 in the example encoder 460 respectively perform character encoding, and one hot encoding. In some examples, the one character encoding, and the one hot encoding are performed on every character in a data point, using the global character map. For example, if "Y," "e," and "s" are associated with numbers 4, 2, and 1 in the global character map, and encoded as "0100", "0010," and "0001" by the character encoder, respectively, the character encoder may encode the first data point in column 224 to "0111."

In some implementations, the neural network layers in the encoder 460 include convolution, dropout, linear, and exponential linear unit layers. In some examples, at least one of the layers is a fully connected layer. In the depicted example, layers 466, 470 are 2-D convolution layers with kernel size of 50×3, with strides of 1×1, where 50 is the dimension of the one character after encoding; but other sizes and dimensions for the convolution layers are feasible. The output channel (e.g., number of filters) for the two convolution layers 466, 470 are 10 and 20, respectively; but other sizes are also feasible. The dropout layers 468, 472 can have random weights while the network is being trained. For example, the dropout layers are not utilized during a testing stage.

The encoder 460 also has linear layers and exponential linear units in Layer 5, Layer 6, and Layer 7. A linear layer in the sting encoder 460 can be similar (e.g., have similar weights) or different (e.g., different weights in one or more neurons) from a linear layer in the categorical encoder 420. The linear layers 474, 478, 482 have a batch sizes of 512, 256, and 128, respectively; but other sizes are feasible as well. In some examples, the exponential linear units 476, 480, 484 are used as activation functions in the fully connected Layers 1, and Layer 2. A exponential layer in the sting encoder 460 can be similar (e.g., have similar weights) or different (e.g., different weights in one or more neurons) from an exponential layer in the categorical encoder 420.

Referring again to FIG. 4A, in the depicted example, the data columns encoded at in the encoding 404 are concatenated at concatenation embedding 406. In some examples, the encoded columns are concatenated in a pre-defined order (e.g., concatenating output of string encoders after output of categorical encoders, and after output of numerical encoders). In some examples, the encoded columns are concatenated in the order that they are output from the column-type encoding 404. For each of the query data set, and the target data set, the output of the concatenation embedding 406 is concatenated data (e.g., a concatenated vector). The concatenated data has a size that depends on the sizes of the outputs of the encoding 404. For example, if a target data set with 6 categorical columns, 1 numerical column, and 6 string columns, a concatenated data of 1013 dimensions can be provided for the target data set (e.g., because the output of the categorical, the numerical, and the string encoders have 20, 5, and 128 dimensions, respectively).

The concatenated data from the query data set, and the target data set are input to one or more fully connected layers 408 (e.g., three fully connected layers). A neuron in a fully connected layer is connected to all neurons (or activations) in a layer right before the linear layer (also can be referred to as the "previous layer"). Examples of a fully connected layer include, but are not limited to a linear layer, and an exponential layer.

The outputs of the fully connected layers for the query data set, and the target data set are each mapped to latent space to provide respective multi-dimensional vectors for the query data set, and the target data set. In some examples, the multi-dimensional vector for the query data set has the same dimensionality as the multi-dimensional vector of the query data set. In one non-limiting example, each of the multi-dimensional vectors has 128 dimensions.

The multi-dimensional vectors are input to the loss determiner 412 to provide an output that indicates one or more matching data points between the query data set, and the target data set. The loss determiner can be used to lower errors in data matchings. In some implementations, the loss determiner includes a loss function that determines the difference between two or more input data. In some examples, the difference is calculated by the cosine distance between the inputs. In some examples, the loss function is evaluated in the latent space, and error is back-propagated to different layers of the network.

In some implementations, to minimize the distance between a matching data pair of the query data set, and the target data set, triplet mining is used for computing the loss function. For this purpose, supervised training is performed. For example, training data of a certain batch size (e.g., size of 100) for both the query data set, and the target data set is provided. Using each query data point as an anchor point, the matching points are positive targets, and non-matching points are negative targets. For the selected anchor point, one of the positive targets is selected, and cosine similarity is computed between the positive target and the anchor point. The cosine similarity is computed between all negative targets, and the anchor point. The closest four negative points to the anchor point is selected for computing the loss function. After gathering cosine similarity for the positive target and selective negative targets with respect to the anchor, a Softmax function is used to compute the probability of the similarity between the anchor query and selective targets. Additive inverse of mean value of all the probabilities between anchor point and positive target is computed as the final loss function. In some examples, momentum optimizer is used to minimize the loss function. The error in each layer is back propagated, and corresponding weights are adjusted.

Figure 5:
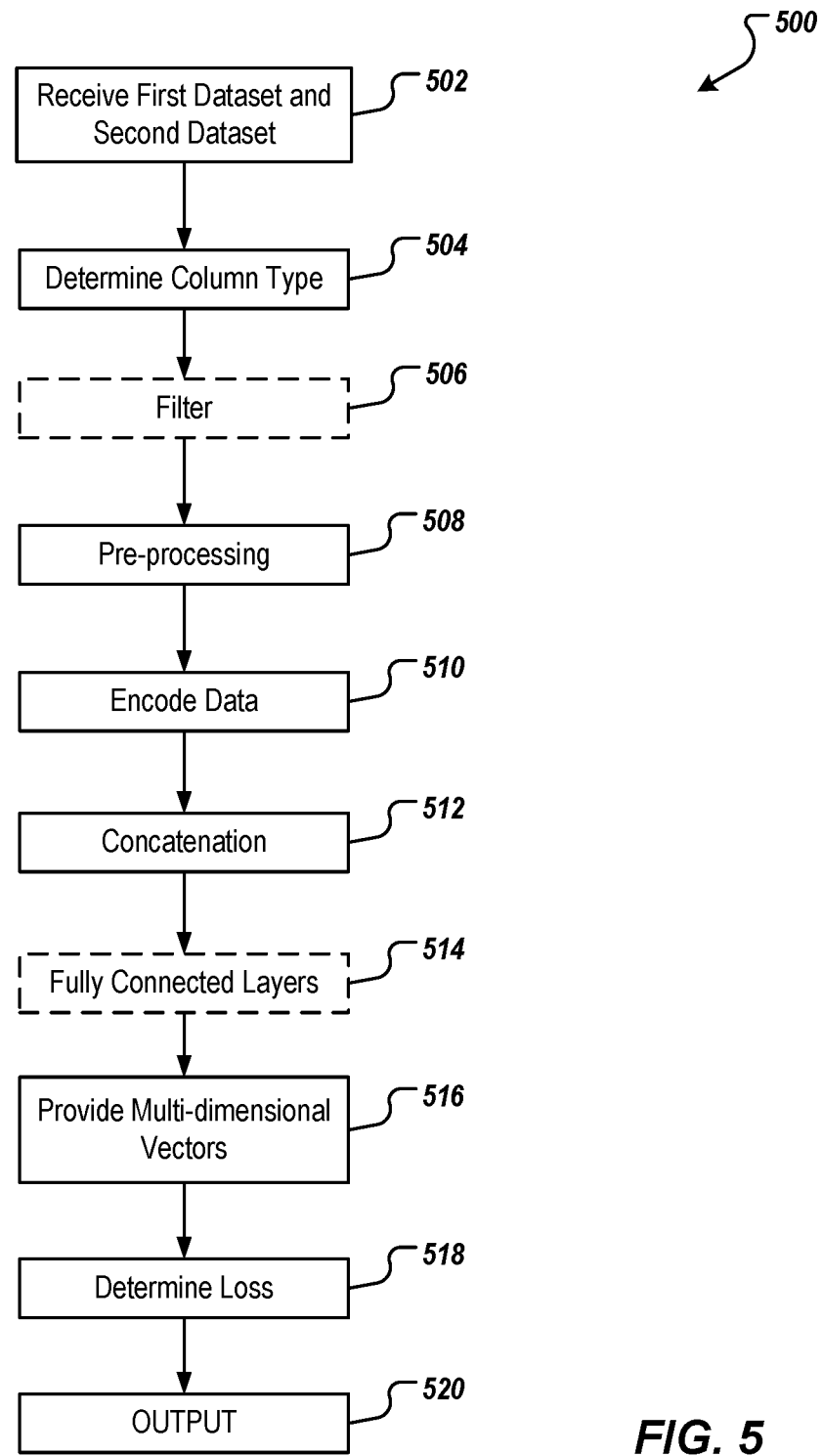
FIG. 5 depicts an example process that can be executed in accordance with implementations of the present disclosure.

FIG. 5 depicts an example process 500 that can be executed in accordance with implementations of the present disclosure. In some implementations, the example process 500 may be performed using one or more computer-executable programs executed using one or more computing devices.

First and second data sets are received (502). For example, the first data set is a query data set, and the second data set is a target data set. In some examples, the first and the second data set are received at the back-end system 106 (e.g., from a database). In some examples, at least one of the data sets is received from the user 114, or the database 120. In some examples, more than one first data set or more than one second data set are received.

Column types are determined (504). For example, for each column of the first and the second data sets, it is determined whether the column is a categorical, a numerical, a string, or a date type. As described herein, in some examples, the type of a column is determined at least partially based on a degree of variation of the data points in the column. For example, if the data points of a column have a relatively low degree of variation, the column is categorized as categorical. In some implementations, one or more columns are filtered (506). In some examples, filtering includes removing a column from consideration in the matching process. In some examples, whether a column is filtered is determined based on the contents of the column. For example, a column can be filtered out from the columns of a data set, if all of the data points in the column have the same value (e.g., numbers, and/or characters).

The columns are pre-processed (508). For example, the data points in each column are modified to provide data points of equal length. In some examples, and as described herein, zeros can be pre-pended to number, or spaces can be pre-pended to character strings to provide equal-length data points within a column. In some examples, each column of the first and the second data sets is pre-processed. In some examples, only columns that remain intact after the filtering, if filtering is implemented, are pre-processed.

Data values in the columns are encoded (510). For example, each column of the first and the second data sets are input to a respective encoder. In some examples, the encoders are specific to the column types. In some examples, each encoder processes only one type of column. In some examples, the same encoders are used for the first and the second data sets. In some examples, depending on whether a column is from the first data set, or the second data set, different encoders are used. In some examples, one or more encoders include one or more neural network layers. The encoded data is concatenated (512). For example, the encoded data is concatenated in a pre-defined order. In some examples, concatenation is performed after all of the columns of a data set are encoded. In some examples, concatenation is performed in parallel with the data encoding (e.g., a column is concatenated, while encoding of other columns continues).

In some implementations, the concatenated data is input to fully connected layers (514). For example, the concatenated data is provided to three fully connected layers. These fully connected layers can be provided to further process the data. Multi-dimensional vectors are provided (516). For example, the multi-dimensional vectors are provided from the concatenated data. In some examples, a multi-dimensional vector is provided for each of the first data set, and the second data set. In some examples, each multi-dimensional vector is a multi-dimensional representation of a respective data set. In some examples, the number of dimensions of the multi-dimensional vector for the first data set, and the second data set is equal. In some example, the dimensions of all multi-dimensional vectors for all the first data set, and the second data set is 128 dimensions.

Loss is determined based on the multi-dimensional vectors (518). For example, the multi-dimensional vectors are provided to a loss function to determine the distance between data points of the first data set, and the second data set. In some example, distance is determined as a cosine difference between the multi-dimensional vectors. An output is provided (520). In some examples, the output indicates matching data points between the first data set, and the second data set. In some examples, the matching data points (or data columns) are transmitted to the computing device 114, and/or are sent to another processing unit to be used for further data analysis. The computing device 114 can display or perform further computations and analysis on the output.

FIG. 6 depicts a schematic diagram of an example computing system 600. The system 600 may be used to perform the operations described with regard to one or more implementations of the present disclosure. For example, the system 600 may be included in any or all of the server components, or other computing device(s), discussed herein. The system 600 may include one or more processors 610, one or more memories 620, one or more storage devices 630, and one or more input/output (I/O) devices 640. The components 610, 620, 630, 640 may be interconnected using a system bus 650.

The processor 610 may be configured to execute instructions within the system 600. The processor 610 may include a single-threaded processor or a multi-threaded processor. The processor 610 may be configured to execute or otherwise process instructions stored in one or both of the memory 620 or the storage device 630. Execution of the instruction(s) may cause graphical information to be displayed or otherwise presented via a user interface on the I/O device 640.

The memory 620 may store information within the system 600. In some implementations, the memory 620 is a computer-readable medium. In some implementations, the memory 620 may include one or more volatile memory units. In some implementations, the memory 620 may include one or more non-volatile memory units.

The storage device 630 may be configured to provide mass storage for the system 600. In some implementations, the storage device 630 is a computer-readable medium. The storage device 630 may include a floppy disk device, a hard disk device, an optical disk device, a tape device, or other type of storage device. The I/O device 640 may provide I/O operations for the system 600. In some implementations, the I/O device 640 may include a keyboard, a pointing device, or other devices for data input. In some implementations, the I/O device 640 may include output devices such as a display unit for displaying graphical user interfaces or other types of user interfaces.

The features described may be implemented in digital electronic circuitry, or in computer hardware, firmware, software, or in combinations of them. The apparatus may be implemented in a computer program product tangibly embodied in an information carrier (e.g., in a machine-readable storage device) for execution by a programmable processor; and method steps may be performed by a programmable processor executing a program of instructions to perform functions of the described implementations by operating on input data and generating output. The described features may be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that may be used, directly or indirectly, in a computer to perform a certain activity or bring about a certain result. A computer program may be written in any form of programming language, including compiled or interpreted languages, and it may be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. Elements of a computer may include a processor for executing instructions and one or more memories for storing instructions and data. Generally, a computer may also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory may be supplemented by, or incorporated in, application-specific integrated circuits (ASICs).

To provide for interaction with a user, the features may be implemented on a computer having a display device such as a cathode ray tube (CRT) or liquid crystal display (LCD) monitor for displaying information to the user and a keyboard and a pointing device such as a mouse or a trackball by which the user may provide input to the computer.

The features may be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system may be connected by any form or medium of digital data communication such as a communication network. Examples of communication networks include, e.g., a local area network (LAN), a wide area network (WAN), and the computers and networks forming the Internet.

The computer system may include clients and servers. A client and server are generally remote from each other and typically interact through a network, such as the described one. The relationship of client and server arises by virtue of computer programs running on the respective computers and having a client-server relationship to each other.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

A number of implementations of the present disclosure have been described. Nevertheless, it will be understood that various modifications may be made without departing from the spirit and scope of the present disclosure. Accordingly, other implementations are within the scope of the following claims.

What is claimed is:

1. A computer-implemented method executed by one or more processors, the method comprising:
   receiving a first data set and a second data set, both the first data set and the second data set comprising structured data in a plurality of columns;
   pre-processing data values of each column of each of the first data set and the second data set, such that data values within individual columns are of a same length in terms of number of characters;
   for each of the first data set and the second data set, inputting each column into an encoder specific to a column type of a respective column, the encoder providing encoded data for the first data set, and the second data set, respectively;
   providing a first multi-dimensional vector based on encoded data of the first data set by mapping a first output of first fully connected layers to a latent space independently of a second output of second fully connected layers;
   providing a second multi-dimensional vector based on encoded data of the second data set by mapping the second output of the second fully connected layers to the latent space independently of the first output of the first fully connected layers; and
   outputting the first multi-dimensional vector and the second multi-dimensional vector to a loss-function, the loss-function processing the first multi-dimensional vector and the second multi-dimensional vector to provide an output, the output comprising a difference between the first multi-dimensional vector and the second multi-dimensional vector representing an exact match between a data point of the first data set and a data point of the second data set.

2. The method of claim 1, wherein a same encoder is used to provide the encoded data of the first data set, and the encoded data of the second data set.

3. The method of claim 1, wherein pre-processing comprises pre-appending one or more zeros to a numerical data value.

4. The method of claim 1, wherein pre-processing comprises pre-appending one or more spaces to a string data value.

5. The method of claim 1, further comprising filtering at least one column from each of the first data set, and the second data set prior to providing encoded data.

6. The method of claim 1, further comprising determining a column type for each column of the plurality of columns.

7. A non-transitory computer-readable storage medium coupled to one or more processors and having instructions stored thereon which, when executed by the one or more processors, cause the one or more processors to perform operations, the operations comprising:
   receiving a first data set and a second data set, both the first data set and the second data set comprising structured data in a plurality of columns;
   pre-processing data values of each column of each of the first data set and the second data set, such that data values within individual columns are of a same length in terms of number of characters;
   for each of the first data set and the second data set, inputting each column into an encoder specific to a column type of a respective column, the encoder providing encoded data for the first data set, and the second data set, respectively;
   providing a first multi-dimensional vector based on encoded data of the first data set by mapping a first output of first fully connected layers to a latent space independently of a second output of second fully connected layers;
   providing a second multi-dimensional vector based on encoded data of the second data set by mapping the second output of the second fully connected layers to the latent space independently of the first output of the first fully connected layers; and
   outputting the first multi-dimensional vector and the second multi-dimensional vector to a loss-function, the loss-function processing the first multi-dimensional vector and the second multi-dimensional vector to provide an output, the output comprising a difference between the first multi-dimensional vector and the second multi-dimensional vector representing an exact match between a data point of the first data set and a data point of the second data set.

8. The computer-readable storage medium of claim 7, wherein a same encoder is used to provide the encoded data of the first data set, and the encoded data of the second data set.

9. The computer-readable storage medium of claim 7, wherein pre-processing comprises pre-appending one or more zeros to a numerical data value.

10. The computer-readable storage medium of claim 7, wherein pre-processing comprises pre-appending one or more spaces to a string data value.

11. The computer-readable storage medium of claim 7, wherein operations further comprise filtering at least one column from each of the first data set, and the second data set prior to providing encoded data.

12. The computer-readable storage medium of claim 7, wherein operations further comprise determining a column type for each column of the plurality of columns.

13. A system, comprising:
a computing device; and
a computer-readable storage device coupled to the computing device and having instructions stored thereon which, when executed by the computing device, cause the computing device to perform operations, the operations comprising:
  receiving a first data set and a second data set, both the first data set and the second data set comprising structured data in a plurality of columns;
  pre-processing data values of each column of each of the first data set and the second data set, such that data values within individual columns are of a same length in terms of number of characters;
  for each of the first data set and the second data set, inputting each column into an encoder specific to a column type of a respective column, the encoder providing encoded data for the first data set, and the second data set, respectively;
  providing a first multi-dimensional vector based on encoded data of the first data set by mapping a first output of first fully connected layers to a latent space independently of a second output of second fully connected layers;
  providing a second multi-dimensional vector based on encoded data of the second data set by mapping the second output of the second fully connected layers to the latent space independently of the first output of the first fully connected layers; and
  outputting the first multi-dimensional vector and the second multi-dimensional vector to a loss-function, the loss-function processing the first multi-dimensional vector and the second multi-dimensional vector to provide an output, the output comprising a difference between the first multi-dimensional vector and the second multi-dimensional vector representing an exact match between a data point of the first data set and a data point of the second data set.

14. The system of claim 13, wherein a same encoder is used to provide the encoded data of the first data set, and the encoded data of the second data set.

15. The system of claim 13, wherein pre-processing comprises pre-appending one or more zeros to a numerical data value.

16. The system of claim 13, wherein pre-processing comprises pre-appending one or more spaces to a string data value.

17. The system of claim 13, wherein operations further comprise filtering at least one column from each of the first data set, and the second data set prior to providing encoded data.

* * * * *